US008890171B2

(12) United States Patent
Woo et al.

(10) Patent No.: US 8,890,171 B2
(45) Date of Patent: Nov. 18, 2014

(54) METHOD OF FABRICATING SINGLE-LAYER GRAPHENE

(71) Applicant: Samsung Electronics Co., Ltd., Suwon-si (KR)

(72) Inventors: Yun-sung Woo, Yongin-si (KR);
Seon-mi Yoon, Yongin-si (KR);
Hyeon-jin Shin, Suwon-si (KR);
Dong-wook Lee, Suwon-si (KR);
Jae-young Choi, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/937,563

(22) Filed: Jul. 9, 2013

(65) Prior Publication Data
US 2014/0014970 A1  Jan. 16, 2014

(30) Foreign Application Priority Data

Jul. 12, 2012  (KR) ........................ 10-2012-0076281

(51) Int. Cl.
*H01L 29/15* (2006.01)
*H01L 21/02* (2006.01)
*H01L 29/16* (2006.01)

(52) U.S. Cl.
CPC ...... *H01L 21/02527* (2013.01); *H01L 29/1606* (2013.01); *Y10S 977/734* (2013.01)
USPC ............................. 257/77; 438/478; 977/734

(58) Field of Classification Search
CPC .................. H01L 21/02527; H01L 29/1606
USPC ............................. 257/77; 438/478; 977/734
See application file for complete search history.

(56) References Cited

U.S. PATENT DOCUMENTS

| 8,187,955 B2* | 5/2012 | Chu et al. ........................ 438/479 |
| 2010/0323164 A1* | 12/2010 | Ogihara et al. ............... 428/156 |
| 2011/0143093 A1* | 6/2011 | Kusunoki et al. ............. 428/141 |
| 2013/0126865 A1* | 5/2013 | Chiang et al. .................. 257/48 |
| 2013/0285212 A1* | 10/2013 | Wei et al. ...................... 257/618 |

FOREIGN PATENT DOCUMENTS

| JP | 2011230959 A | 11/2011 |
| JP | 2012031024 A | 2/2012 |
| KR | 2010-0093965 A | 8/2010 |
| KR | 20100130863 A | 12/2010 |
| KR | 20110038721 A | 4/2011 |
| KR | 20110138195 A | 12/2011 |
| KR | 20120000338 A | 1/2012 |

OTHER PUBLICATIONS

K.S. Novoselov, Electric Field Effect in Atomically Thin Carbon Films, Oct. 22, 2004, vol. 306, www.sciencemag.org, pp. 666-669.

* cited by examiner

*Primary Examiner* — Trung Q Dang
(74) *Attorney, Agent, or Firm* — Harness, Dickey & Pierce, P.L.C.

(57) ABSTRACT

A method of fabricating a single-layer graphene on a silicon carbide (SiC) wafer includes forming a plurality of graphene layers on the SiC wafer such that the plurality of graphene layers are on a buffer layer of the SiC wafer, the buffer layer being formed of carbon; removing the plurality of graphene layers from the buffer layer; and converting the buffer layer to a single-layer graphene.

18 Claims, 3 Drawing Sheets

METHOD OF FABRICATING SINGLE-LAYER GRAPHENE

CROSS-REFERENCE TO RELATED APPLICATIONS

This application claims priority under 35 U.S.C.§119 to Korean Patent Application No. 10-2012-0076281, filed on Jul. 12, 2012, in the Korean Intellectual Property Office, the disclosure of which is incorporated herein in its entirety by reference.

BACKGROUND

1. Field

Example embodiments relate to methods of fabricating a single-layer graphene on the entire surface of a silicon carbide (SiC) wafer.

2. Description of the Related Art

Graphene, a hexagonal single-layer structure that is formed of carbon atoms, is structurally and chemically stable, and exhibits electrically and physically superior properties. For example, graphene has a charge mobility of approximately $2\times10^5$ cm$^2$/Vs that is more than 100 times faster than silicon (Si) while having a current density of approximately $10^8$ A/cm$^2$ that is more than 100 times greater than copper (Cu). In particular, when graphene nanoribbon (GNR) is fabricated to have a channel width of 10 nm or less by using graphene having a zero band gap, a band gap is formed by a size effect and thus a field effect transistor capable of operating at room temperature may be fabricated.

In order to form a graphene device by using graphene on a silicon carbide (SiC) single crystal substrate, a single-layer graphene on the SiC single crystal substrate is required.

When a thermal treatment of the SiC single crystal substrate is performed at a temperature of 1300° C. or higher to form a graphene layer thereon, a graphene layer is formed on the surface of the SiC single crystal substrate as Si on the surface of the SiC single crystal substrate is sublimated. In this state, the graphene layer may be mixed with a single-layer graphene and a multilayer graphene. In particular, when a step portion is formed on the SiC substrate, a multilayer graphene is easily formed at the step portion. Thus, it is difficult to form a single-layer graphene on the entire surface of a SiC wafer by using the conventional method.

SUMMARY

At least one example embodiment is related to a method of fabricating a single-layer graphene on the entire surface of a SiC wafer.

In one example embodiment, a method of fabricating a single-layer graphene on a SiC wafer includes forming a plurality of graphene layers on the SiC wafer such that the plurality of graphene layers are on a buffer layer of the SiC wafer, the buffer layer being formed of carbon; removing the plurality of graphene layers from the buffer layer; and converting the buffer layer to a single-layer graphene.

According to an example embodiment, the buffer layer may be a top layer of the SiC wafer.

According to an example embodiment, the forming of the plurality of graphene layers may include sublimating silicon of the SiC wafer.

According to an example embodiment, sublimating silicon of the SiC wafer may include performing a thermal treatment on the SiC wafer in a chamber at a pressure between $10^{-9}$ torr, at a temperature of at least 1300° C., and for a time of 5 to 60 minutes.

According to an example embodiment, the removing the plurality of graphene layers may include intercalating acid or alkali metal between the plurality of graphene layers and between the plurality of graphene layers and the buffer layer, and detaching the plurality of graphene layers by using an an adhesive member.

According to an example embodiment, the adhesive member may be one of a polydimethylsiloxane (PDMS) and an adhesive tape.

According to an example embodiment, the intercalating of the acid may be performed by dipping the SiC wafer in a solution in which sulfuric acid and nitric acid are mixed at a molar ratio of 80:20.

According to an example embodiment, the intercalating of the alkali metal may include intercalating alkali metal atoms by sublimating the alkali metal.

According to an example embodiment, the alkali metal may be at least one metal is at least one of lithium (Li), potassium (K), rubidium (Rb), and cesium (Cs).

According to an example embodiment, removing the plurality of graphene layers may include intercalating acid or alkali metal between the plurality of graphene layers and between the plurality of graphene layers and the buffer layer; and detaching the plurality of graphene layers using an ultrasonic wave.

According to an example embodiment, the ultrasonic wave may be generated at a frequency of 10 to 20 kHz for 20 minutes.

According to an example embodiment, the converting of the buffer layer to the single-layer graphene may include thermally treating the SiC wafer in a hydrogen atmosphere or lithium gas atmosphere to make a silicon-hydrogen bond or lithium-silicon bond, respectively.

According to an example embodiment, the removing the plurality of graphene layers may include forming a metal adhesive layer on the plurality of graphene layers, forming a polymer support member on the metal adhesive layer, and drawing the polymer support member in a direction away from the SiC wafer.

According to an example embodiment, the metal adhesive layer may be attached to at least one of the plurality of graphene layers.

According to an example embodiment, the metal adhesive layer may be formed of at least one of nickel (Ni), cobalt (Co), gold (Au), copper (Cu), palladium (Pd), titanium (Ti), and chrome (Cr).

According to an example embodiment, the metal adhesive layer may be formed to have a thickness of 10 to 1000 nm.

According to an example embodiment, the polymer support member may be formed to have a thickness of 50 to 500 µm.

According to an example embodiment, the method may further include determining, using a Raman spectrometer, that the plurality of graphene layers are no longer on the buffer layer.

According to an example embodiment, a SiC wafer may include a single-layer graphene formed on an entire surface of the SiC wafer, the SiC wafer being fabricated by the method.

According to an example embodiment, a field-effect transistor array may use the single-layer graphene on the SiC wafer being fabricated by the method as channels of the field-effect transistor array, the channels being a patterned single-layer graphene.

Specific particulars of various embodiments are included in detailed descriptions and drawings. Aspects of the present invention should not be limited by the above description, and other unmentioned aspects will be clearly understood by one of ordinary skill in the art from example embodiments described herein.

BRIEF DESCRIPTION OF THE DRAWINGS

The above and other features and advantages will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1:
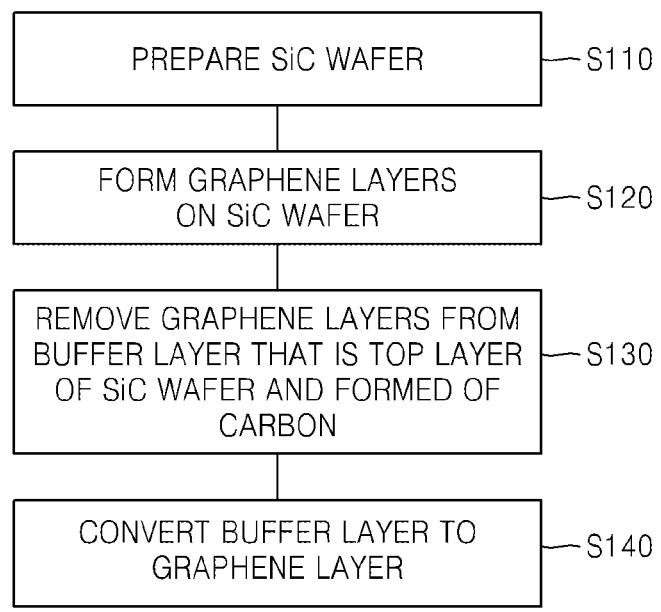
FIG. 1 is a flowchart showing a method of fabricating a single-layer graphene on an entire surface of a SiC wafer, according to an various embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made in detail to embodiments, examples of which are illustrated in the accompanying drawings, wherein like reference numerals refer to like elements throughout. In the drawings, the thicknesses of layers and regions are exaggerated for clarity. It will also be understood that when a layer is referred to as being "on" another layer or substrate, it can be directly on the other layer or substrate, or intervening layers may also be present.

FIG. 1 is a flowchart showing a method of fabricating a single-layer graphene on the entire surface of a SiC single crystal substrate (hereinafter, referred to as a SiC wafer), according to various embodiments. Referring to FIG. 1, the SiC wafer is prepared (S110). The SiC wafer may have a diameter of approximately 4 inches. However, the SiC wafer is not limited thereto and a SiC wafer having a diameter of 4 or more inches may be used.

Multilayer graphene is formed on the SiC wafer (S120). In detail, the SiC wafer is thermally treated at a pressure of $10^{-9}$ torr and a temperature of 1300° C. or higher for approximately 5 to 60 minutes to sublimate silicon (Si), and thus, multilayer graphene is formed on the SiC wafer. The number of graphene layers in the multilayer graphene may vary according to a thermal treatment condition. Sigma bonds between carbon-silicon are broken and approximately 3-4 carbon layers are rearranged to form a single-layer graphene. As the sublimation process continues, multilayer graphene is formed.

In the SiC wafer, the top layer contacting the multilayer graphene is formed of carbon. Although a bonding strength of the top layer is relatively strong due to a covalent bond with silicon under the top layer, the top layer does not exhibit the electrical intrinsic properties of a graphene layer. The top layer is hereinafter referred to as a buffer layer in the following description.

The multilayer graphene having a weak bonding strength with the buffer layer is detached from the SiC wafer (S130).

The buffer layer is converted to a single-layer graphene (S140). The buffer layer has a covalent bond with the silicon under the buffer layer. The SiC wafer may be thermally treated in a hydrogen gas or silicon gas atmosphere. When the SiC wafer is thermally treated in a hydrogen gas atmosphere, the silicon bonded under the buffer layer combines with hydrogen gas to make a silicon-hydrogen bond. When a silicon gas is used, the silicon bonded under the buffer layer combines with the silicon gas to make a silicon-silicon bond causing the covalent bond between the buffer layer and the silicon to break. Thus, the buffer layer is converted to a single-layer graphene having graphene properties.

Figure 2A:
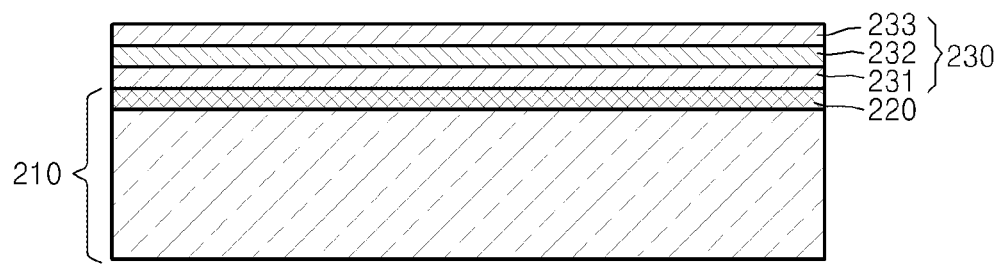
FIGS. 2A through 2D show cross-sectional views illustrating steps of a method of fabricating a single-layer graphene on the entire surface of a SiC wafer, according to an various embodiments.

FIGS. 2A through 2D show cross-sectional views schematically illustrating steps of a method of fabricating a single-layer graphene on the entire surface of a SiC wafer 210, according to an various embodiments. Referring to FIG. 2A, the SiC wafer 210 is prepared. The SiC wafer 210 may be a 4-inch wafer, but is not limited thereto. According to other example embodiments, a SiC wafer having a diameter of 6 inches or greater may be used as the SiC wafer 210.

When a thermal treatment is performed on the SiC wafer 210 in a chamber (not shown) at a pressure of $10^{-9}$ torr or less and a temperature of 1300° C. or higher for approximately 5 to 60 minutes, a multilayer graphene 230 is formed on the SiC wafer 210 as Si on the SiC wafer 210 is sublimated. In the multilayer graphene 230, the number of graphene layers may vary according to a thermal treatment condition. The multilayer graphene 230 may include a plurality of graphene layers. For convenience of explanation, the multilayer graphene 230 includes three graphene layers 231 to 233.

In the SiC wafer 210, the top layer contacting the multilayer graphene 230 is formed of carbon. However, the bonding strength of the top layer is relatively strong due to a covalent bond with silicon under the top layer. Additionally, the top layer does not exhibit the electrical intrinsic properties of a graphene layer. Therefore, the top layer is referred to as a buffer layer 220.

Figure 2B:
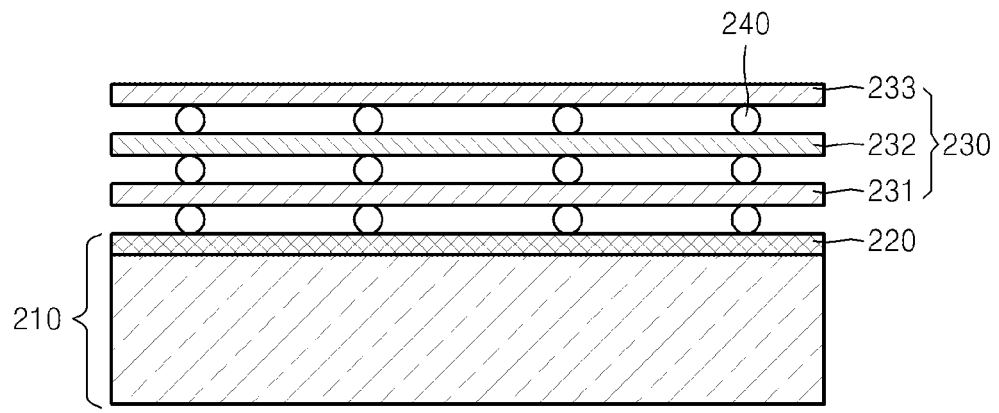

Referring to FIG. 2B, the strong bonds between the buffer layer 220 and the multilayer graphene 230 are weakened by intercalating a chemical substance 240 between each layer of the multilayer graphene 230 and between the buffer layer 220 and the graphene layer 231 of the multilayer graphene 230.

According to an example embodiment, the SiC wafer 210 may be dipped in an acid solution. For example, the SiC wafer 210 may be dipped in a solution in which sulfuric acid and nitric acid are mixed at a molar ratio of 80:20, for approximately 2 to 3 hours. In this embodiment, the chemical substance 240 consists of nitric acid ions and sulfuric acid ions that are intercalated between the buffer layer 220 and the graphene layer 231 and between the layers of the multilayer graphene 230. As a result, the bonding strength between the multilayer graphene 230 and the buffer layer 220 is weakened.

According to another embodiment, instead of the mixed solution of sulfuric acid and nitric acid, HNO3, H2SO4, HClO4, Cl2O7, SbCl5, SbF5, Br2, AlCl3, FeCl3, AsF5, or other like acids in an ion state, may be intercalated between the graphene layer 231 and the buffer layer 220 as described above.

According to yet another embodiment, alkali metal atoms may be intercalated between the graphene layer 231 and the buffer layer 220. Lithium (Li), potassium (K), rubidium (Rb), cesium (Cs), or other like substances may be used as the alkali metal. To intercalate alkali metal atoms, the alkali metal may be sublimated. As time passes, the sublimated alkali metal is intercalated between the graphene layer 231 and the buffer layer 220.

Figure 2C:
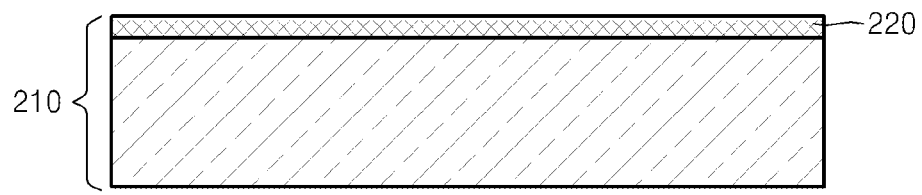

Referring to FIG. 2C, the multilayer graphene 230 on the buffer layer 220 is detached from the buffer layer 220 (not shown). According to an example embodiment, when the SiC wafer 210 is dipped in a solution where an ultrasonic apparatus (not shown) is arranged and an ultrasonic wave at a frequency of approximately 10 to 20 kHz is generated for approximately 20 minutes, a whirlpool motion is generated by bubble vibrations that are generated by cavitation and thus the multilayer graphene 230 having a weak bonding strength is separated from the buffer layer 220.

According to another example embodiment, an adhesive member such as polydimethylsiloxane (PDMS) or an adhesive tape is attached on the multilayer graphene 230 and then the adhesive member is removed in a direction away from the SiC wafer 210. As a result, a graphene layer attached to the adhesive member is detached. By repeating this process, the graphene layers 231-233 of the multilayer graphene 230 may be detached from the buffer layer 220.

A Raman spectrometer may be used to confirm that a graphene layer is not formed on the buffer layer 220 by checking whether a 2D peak, that is a graphene peak, exists in a Raman spectrum. As the number of graphene layers of the multilayer graphene 230 decreases, compressive strain of the graphene layer decreases and thus the wave number of a 2D peak decreases. When the 2D peak is significantly reduced or no longer exists, it may be determined that all or most of the graphene layers of the multilayer graphene 230 have been separated from the buffer layer 220.

Figure 2D:
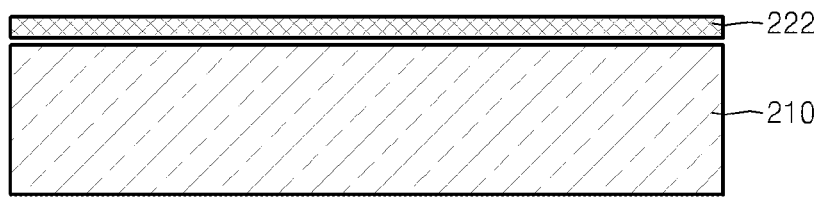

Referring to FIG. 2D, the buffer layer 220 makes a covalent bond with silicon disposed thereunder (not shown). When the SiC wafer 210 is arranged in a chamber in a hydrogen atmosphere at approximately 600 to 1000° C., hydrogen bonds with the silicon that is bonded to the buffer layer 220. Accordingly, a covalent bond between the buffer layer 220 and the silicon is broken and thus the buffer layer 220 is converted to a single-layer graphene 222 having graphene properties.

According to an alternative embodiment, the covalent bond of the buffer layer 220 may be broken by sublimating lithium in a similar manner as described above. In other words, by sublimating the lithium, lithium is bonds with the silicon that is bonded to the buffer layer 220. Accordingly, the covalent bond between the buffer layer 220 and the silicon is broken and thus the buffer layer 220 is converted to a single-layer graphene 222 having graphene properties.

According to the above-described embodiment, the buffer layer 220 formed of carbon and the multilayer graphene 230 on the buffer layer 220 is formed on a surface of the SiC wafer 201, and once the multilayer graphene 230 is removed, the buffer layer 220 remains as the top layer of the SiC wafer 210. By converting the buffer layer 220 to a single-layer graphene 222, the single-layer graphene 222, which is uniformly distributed on the entire surface of the SiC wafer 210, may be fabricated.

Figure 3:
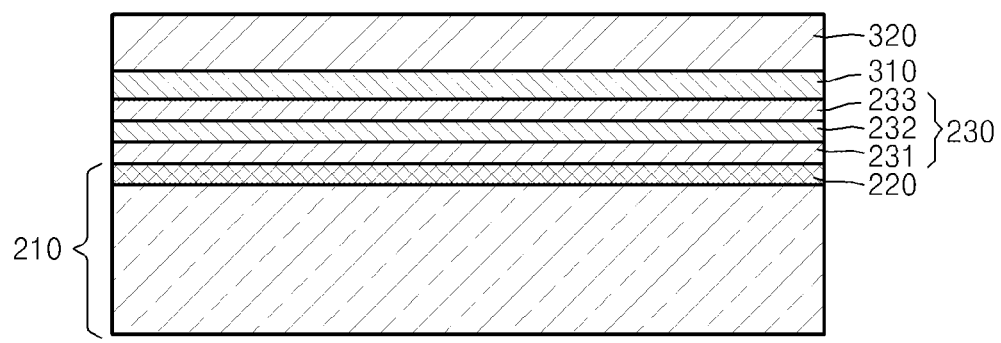
FIG. 3 is a cross-sectional view illustrating a fabricated single-layer graphene on the entire surface of a SiC wafer, according to various embodiments.

FIG. 3 is a cross-sectional view illustrating a single-layer graphene on the entire surface of the SiC wafer 210, according to another example embodiment.

Since the methods of forming the buffer layer 220 and the multilayer graphene 230 on the SiC wafer 210 are described above, detailed descriptions thereof are omitted herein.

Referring to FIG. 3, a metal adhesive layer 310 is formed on the multilayer graphene 230. The metal adhesive layer 310 may be formed to have a thickness of approximately 10 to 1000 nm. The metal adhesive layer 310 is formed to be thinner than the polymer support member 320 (as discussed below) for adhesion to the multilayer graphene 230. The metal adhesive layer 310 may be formed of nickel (Ni), cobalt (Co), gold (Au), copper (Cu), palladium (Pd), titanium (Ti), chrome (Cr), etc. The metal adhesive layer 310 may be formed with a variety of methods such as plating, evaporation, sputtering, chemical vapor deposition (CVD), atomic layer deposition (ALD), or by using other known methods.

A polymer support member 320 is formed on the metal adhesive layer 310 by a spin coating method. The polymer support member 320 may be formed to have a thickness of approximately 50 to 500 μm. The polymer support member 320 is formed to be thicker than the metal adhesive layer 310 to support the metal adhesive layer 310. For example, the polymer support member 320 may be formed of PDMS.

When a force is applied to the polymer support member 320 in a direction away from the SiC wafer 210 (not shown), the metal adhesive layer 310 and the graphene layers 231-233 attached to the metal adhesive layer 310 are separated from the buffer layer 220. In this process, at least one graphene layer of the multilayer graphene 230 is separated.

The multilayer graphene 230 may be substantially or completely detached from the buffer layer 220 by repeating the metal adhesive layer deposition process and the polymer support member coating process, as described above.

A Raman spectrometer may be used to confirm that a graphene layer is not formed on the buffer layer 220 by checking whether a 2D peak that is a graphene peak exists in a Raman spectrum. As the number of graphene layers of the multilayer graphene 230 decreases, compressive strain of the graphene layer decreases and thus the wave number of a 2D peak decreases. When the 2D peak is significantly reduced or no longer exists, it may be determined that all or most of the graphene layers of the multilayer graphene 230 have been separated from the buffer layer 220.

Since the process of converting the buffer layer 220 to a single-layer graphene may be easily understood from the above described embodiment, a detailed description thereof is omitted herein.

According to an example embodiment, a graphene channel may be formed by patterning the single-layer graphene on the SiC wafer. A top gate field-effect transistor of the graphene channel may be fabricated by a method that is well known to those skilled in the art, of which detailed description is omitted herein. According to other embodiments, a plurality of channels may be formed of a single-layer graphene and a plurality of field-effect transistors may be formed thereon, thereby fabricating a field-effect transistor array.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims

What is claimed is:

1. A method of fabricating a single-layer graphene on a silicon carbide (SiC) wafer, the method comprising:
    forming a plurality of graphene layers on the SiC wafer such that the plurality of graphene layers are on a buffer layer of the SiC wafer, the buffer layer being formed of carbon;
    removing the plurality of graphene layers from the buffer layer; and
    converting the buffer layer to a single-layer graphene.

2. The method of claim 1, wherein the buffer layer is a top layer of the SiC wafer.

3. The method of claim 1, wherein the forming a plurality of graphene layers comprises sublimating silicon of the SiC wafer.

4. The method of claim 3, wherein sublimating silicon of the SiC wafer comprises:
    performing a thermal treatment on the SiC wafer in a chamber at a pressure between $10^{-9}$ torr, at a temperature of at least 1300° C., and for a time of 5 to 60 minutes.

5. The method of claim 3, wherein the removing the plurality of graphene layers comprises:
    intercalating acid or alkali metal between the plurality of graphene layers and between the plurality of graphene layers and the buffer layer; and
    detaching the plurality of graphene layers by using an adhesive member.

6. The method of claim 5, wherein the adhesive member is one of a polydimethylsiloxane (PDMS) and an adhesive tape.

7. The method of claim 5, wherein the intercalating of the acid is performed by dipping the SiC wafer in a solution in which sulfuric acid and nitric acid are mixed at a molar ratio of 80:20.

8. The method of claim 5, wherein the intercalating of the alkali metal comprises intercalating alkali metal atoms by sublimating the alkali metal.

9. The method of claim 8, wherein the alkali metal is at least one of lithium (Li), potassium (K), rubidium (Rb), and cesium (Cs).

10. The method of claim 3, wherein removing the plurality of graphene layers comprises:
    intercalating acid or alkali metal between the plurality of graphene layers and between the plurality of graphene layers and the buffer layer; and
    detaching the plurality of graphene layers using an ultrasonic wave.

11. The method of claim 10, wherein the ultrasonic wave is generated at a frequency of 10 to 20 kHz for 20 minutes.

12. The method of claim 1, wherein the converting the buffer layer to the single-layer graphene comprises thermally treating the SiC wafer in a hydrogen atmosphere or in a lithium gas atmosphere to make a silicon-hydrogen bond or lithium-silicon bond, respectively.

13. The method of claim 3, wherein the removing the plurality of graphene layers comprises:
    forming a metal adhesive layer on the plurality of graphene layers;
    forming a polymer support member on the metal adhesive layer; and
    drawing the polymer support member in a direction away from the SiC wafer.

14. The method of claim 13, wherein the metal adhesive layer is attached to at least one of the plurality of graphene layers.

15. The method of claim 13, wherein the metal adhesive layer is formed of at least one of nickel (Ni), cobalt (Co), gold (Au), copper (Cu), palladium (Pd), titanium (Ti), and chrome (Cr).

16. The method of claim 13, wherein the metal adhesive layer is formed to have a thickness of 10 to 1000 nm.

17. The method of claim 13, wherein the polymer support member is formed to have a thickness of 50 to 500 μm.

18. The method of claim 13, further comprising:
    determining, using a Raman spectrometer, that the plurality of graphene layers are no longer on the buffer layer.

* * * * *